(12) United States Patent
Okai et al.

(10) Patent No.: US 10,121,632 B2
(45) Date of Patent: Nov. 6, 2018

(54) CHARGED PARTICLE BEAM APPARATUS

(71) Applicant: Hitachi High-Technologies Corporation, Minato-ku, Tokyo (JP)

(72) Inventors: Nobuhiro Okai, Tokyo (JP); Natsuki Tsuno, Tokyo (JP); Naomasa Suzuki, Tokyo (JP); Tomoyasu Shojo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/487,561

(22) Filed: Apr. 14, 2017

(65) Prior Publication Data

US 2017/0316915 A1 Nov. 2, 2017

(30) Foreign Application Priority Data

Apr. 28, 2016 (JP) ................... 2016-090682

(51) Int. Cl.
| | |
|---|---|
| *H01J 37/244* | (2006.01) |
| *H01J 37/14* | (2006.01) |
| *H01J 37/20* | (2006.01) |
| *H01J 37/28* | (2006.01) |

(52) U.S. Cl.
CPC ............ *H01J 37/244* (2013.01); *H01J 37/14* (2013.01); *H01J 37/20* (2013.01); *H01J 37/28* (2013.01); *H01J 2237/10* (2013.01); *H01J 2237/2448* (2013.01); *H01J 2237/2449* (2013.01); *H01J 2237/24495* (2013.01); *H01J 2237/2809* (2013.01)

(58) Field of Classification Search
USPC ...................................... 250/310, 396 R, 397
See application file for complete search history.

(56) References Cited

U.S. PATENT DOCUMENTS

| | | | |
|---|---|---|---|
| 5,644,132 A | 7/1997 | Litman et al. | |
| 6,555,819 B1 * | 4/2003 | Suzuki | .................... H01J 37/28 250/251 |
| 2003/0122074 A1 | 7/2003 | Suzuki et al. | |
| 2010/0084553 A1 * | 4/2010 | Frosien | ..................... G01T 1/00 250/307 |
| 2012/0298864 A1 * | 11/2012 | Morishita | ............. H01J 37/244 250/310 |
| 2012/0318976 A1 | 12/2012 | Matsumoto et al. | |
| 2016/0336143 A1 * | 11/2016 | Ishii | ........................ H01J 37/28 |

FOREIGN PATENT DOCUMENTS

| | | |
|---|---|---|
| JP | 8-273569 A | 10/1996 |
| JP | 2001-110351 A | 4/2001 |
| JP | 2013-2872 A | 1/2013 |

* cited by examiner

*Primary Examiner* — Kiet T Nguyen
(74) *Attorney, Agent, or Firm* — Crowell & Moring LLP

(57) ABSTRACT

Provided is a charged particle beam apparatus which includes a charged particle source, a sample table on which a sample is placed, a charged particle beam optical system that includes an objective lens and emits a charged particle beam emitted from the charged particle source onto the sample, a plurality of detectors which detect secondary particles emitted from the sample when being irradiated with the charged particle beam, and a rotation member which magnetically, electrically, or mechanically changes a detected azimuth angle of the secondary particles emitted from the sample.

13 Claims, 17 Drawing Sheets

CHARGED PARTICLE BEAM APPARATUS

CLAIM OF PRIORITY

The present application claims priority from Japanese patent application JP 2016-090682 filed on Apr. 28, 2016, the content of which is hereby incorporated by reference into this application.

BACKGROUND OF THE INVENTION

1. Field of the Invention

The present invention relates to a charged particle beam apparatus.

2. Description of the Related Art

A scanning electron microscope as one of the charged particle beam apparatuses is an apparatus which accelerates electrons emitted from a heating type or field emission type of electron source to form a fine electron beam (primary electron beam) using an electrostatic lens or an electromagnetic lens, two-dimensionally scans a sample to be observed using the primary electron beam, detects secondary particles such as secondary electrons or backscattered electrons (reflected electrons) secondarily generated from the sample when being irradiated with the primary electron beam, sets a detected signal intensity to a brightness modulation input of a display device such as a cathode ray tube which performs scanning in synchronization with the scanning of the primary electron beam, and thereby obtains a two-dimensional scanning image.

In a process of manufacturing a semiconductor device, there is a need to observe a situation of defects generated by a failure of the manufacturing process in an in-line environment and to clarify and feedback the cause to the manufacturing process in order to realize an improvement in yield and to stabilize the manufacturing process. The observation of a fine defect is one of principal techniques required for managing the process, and an optical microscope has been used so far to evaluate the defect. However, nowadays a pattern size of the semiconductor device has been minimized, and accordingly sizes of defects adversely affecting on the device properties have been minimized. Therefore, the evaluation using the scanning electron microscope becomes important. Therefore, a scanning electron microscope has been commercialized with which a defect can be reviewed with a high resolution. In the apparatus, it is important to acquire a shaded image of the scanning electron microscope image equivalent to the shading generated when the sample is irradiated with the light from the lateral side in order to detect irregularities such as a fine foreign material or scratches.

A basic principle of acquiring the shaded image using the scanning electron microscope will be described using FIGS. 2A and 2B. Herein, the description will be exemplarily given about a dip of the sample in which a signal profile obtained by detectors provided on either side is changed when an electronic beam is emitted. In FIG. 2A, a detector 33 is provided on the left side of the dip. When a primary electron beam 32 is emitted, secondary electrons 34 emitted in the direction toward the detector 33 are detected. However, on the left side in the dip, some secondary electrons 35 come into conflict with the wall surface of the dip before the particles reach the detector 33, and thus cannot be detected. A signal profile 36 obtained at this time is observed such that the left side of the dip is dark and the right side is bright. On the other hand, in a case where a detector 37 is provided on the right side of the dip, secondary electrons 38 emitted in the direction toward the detector 37 are detected. However, some secondary electrons 39 generated on the right side in the dip come into conflict with the wall surface of the dip, and thus not detected. On the contrary to the above description, a signal profile 40 obtained at this time is observed such that the right side of the dip is dark and the left side is bright. Therefore, in a case where the observation target is recessed, a portion of the observation target near the detector becomes dark, and the opposite side becomes bright. On the other hand, in a case where the observation target is projected, a portion of the observation target near the detector becomes bright, and the opposite side becomes dark. In this way, it is possible to determine whether the shape of the observation target sample is projected or recessed by inspecting a relation of the layout of the detectors and the brightness and darkness of the signal profile.

Even when there is one detector, the irregularity information on one direction of the sample is obtained from the brightness and darkness appearing in the image of the secondary electrons formed using the detector. However, the irregularity information on one direction of the sample can be obtained with more accuracy when a pair of detectors is disposed symmetrically to an optical axis. Further, when a plurality of pairs of detectors are disposed symmetrically to the optical axis, the irregularity information on the surface of the sample can be obtained from a plurality of directions.

A technique of obtaining the irregularity information on the sample on the basis of such a principle is disclosed in JP 2001-110351 A and JP 8-273569 A. In JP 2001-110351 A, an objective lens of a semi-in-lens type is used to achieve a high resolution, the detector is disposed on a side near an electron source of the objective lens, and the electric field between the sample and the objective lens is controlled, so that the reflected electrons emitted in a direction forming a small angle with respect to the surface of the sample are detected and the irregularities of the sample are determined. In JP 8-273569 A, annular detectors are used, and the reflected electrons are detected by an inside annular band, and the secondary electrons are detected by an outside annular band. Then, the outside annular band is divided into four blade parts, a shaded image is obtained by selecting an azimuth angle for emitting the secondary electrons, and a profile of the sample piece and a characteristic of the material are measured. JP 2013-2872 A relates to a technique of quantitatively analyzing a three-dimensional shape of the observation target, in which four independent detectors are provided symmetrically to the optical axis, and the signal profiles obtained by the respective detectors are assembled and analyzed so as to measure a width and a slope angle of an edge of a line pattern.

SUMMARY OF THE INVENTION

According to the related art, a shaded image can be acquired even in the scanning electron microscope similarly to the optical microscope, and the irregularities of a defect and the shape of a pattern can be measured.

However, an azimuth angle component which emits the electrons detected by the respective detectors in the related art is fixed. Therefore, when the shape of a defect in the observation target is changed, the layout of the current detector may be excluded from the optimized condition of the observation. FIGS. 3A and 3B illustrate examples in which two detectors are disposed symmetrically to an optical axis of the primary electron beam. As illustrated in FIG. 3A, it is optimal that detectors 42a and 42b are disposed to be perpendicular to the pattern in order to observe a pattern 41 formed in the longitudinal direction with high accuracy. However, as illustrated in FIG. 3B, in the case of an inclined line 43, when detectors 44a and 44b are disposed to be perpendicular to the line in place of the layout of the detectors 42a and 42b, the shaded image can be obtained with a more highlighted manner. In this way, an optimized layout of the detectors, that is, the azimuth angle component to be detected is made different for the respective patterns.

Therefore, the inventors have reviewed a case where the number of detectors is increased. However, it has been determined that a suitable detector layout is changed depending on the pattern even when the number of detectors is increased. For example, FIGS. 4A and 4B illustrate the optimized layout of the detectors as an example of the following two patterns with respect to the scanning electron microscope in which four detectors 45a to 45d are disposed equally to the optical axis of the primary electrons. FIG. 4A illustrates a line pattern manufactured in a lithography process of a semiconductor, and FIG. 4B is a via in trench pattern (hereinafter, referred to as VIT pattern) manufactured in a wiring process of the preceding process of the semiconductor. FIG. 4A illustrates the detector layout disclosed in JP 2013-2872 A. In the line pattern, it is necessary to detect components perpendicular to the pattern as many as possible for the high accurate measurement. The left image obtained by synthesizing signals obtained by the left lower detector 45a and the left upper detector 45b is used for the edge on the left side of the pattern. On the other hand, the right image obtained by synthesizing signals obtained by the right upper detector 45c and the right lower detector 45d is used for the edge on the right side of the pattern. Therefore, the shape of the pattern can be measured with high accuracy. In a case where the pattern is formed in the lateral direction, the shape is measured using the upper image obtained by synthesizing the signals obtained by the left upper detector 45b and the right upper detector 45c and the lower image obtained by synthesizing the signals obtained by the left lower detector 45a and the right lower detector 45d. However, it cannot be said that this configuration is the optimized layout for the VIT pattern in which a hole shape manufactured in a groove is one of the observation targets.

On the other hand, it is determined that the detector layout illustrated in FIG. 4B is suitable to the VIT pattern. In other words, detectors 46b and 46d are disposed in an extending direction of the trench (the vertical direction in the sheet), and detectors 46a and 46c are disposed in a direction perpendicular to the extending direction (the horizontal direction in the sheet). With the use of the upper detector 46b and the lower detector 46d, the electrons emitted from the inside of the groove can be efficiently detected, and thus the hole of the inside of the groove can be measured with high accuracy. However, in the detector layout illustrated in FIG. 4B, it is not possible to use the detector 46a for measuring the left edge of the line pattern and the detector 46c for measuring the right edge. The obtained amount of signals becomes the half of that in the case of the detector layout in FIG. 4A, and an S/N ratio is low. Therefore, such a layout is not suitable to the line pattern.

In this way, even when the optimized layout of the detectors are different for each measurement target, the layout of the detectors (that is, the azimuth angle components to be detected) is fixed in the related art. Therefore, it is considered that the evaluation has not been necessarily optimized with respect to various types of evaluation patterns.

The invention has been made in view of the above problems, and an object thereof is to provide a charged particle beam apparatus through which a VIT pattern and a line pattern both can be observed and evaluated.

According to the invention, it is possible to provide a charged particle beam apparatus through which the VIT pattern and the line pattern both can be observed and evaluated.

As one embodiment for achieving the object, a charged particle beam apparatus, includes:

a charged particle source;

a sample table on which a sample is placed;

a charged particle beam optical system that includes an objective lens, and emits charged particles emitted from the charged particle source onto the sample as a charged particle beam;

a plurality of detectors that emit the charged particle beam to detect secondary particles emitted from the sample; and a rotation member that magnetically, electrically, or mechanically changes a detected azimuth angle in the detector of the secondary particles emitted from the sample.

In addition, as another embodiment, a charged particle beam apparatus, includes:

a charged particle source;

a sample table on which a sample is placed;

a charged particle beam optical system that emits charged particles emitted from the charged particle source onto the sample as a charged particle beam;

a plurality of detectors that are disposed at positions symmetrically to an optical axis of the charged particle beam, and detect secondary particles emitted from the sample when being irradiated with the charged particle beam;

a rotation member that changes a detected azimuth angle in the detector of the secondary particles emitted from the sample; and a controller that is connected to a monitor to display a screen to designate a rotation angle of the azimuth angle of the secondary particles, and controls the components.

DESCRIPTION OF THE PREFERRED EMBODIMENTS

Hereinafter, embodiments of the invention will be described using the drawings. Further, an electron microscope will be described in the embodiment, but the invention may also be applied to an ion microscope. In FIGS. 2A and 2B and the subsequent drawings, the same functional portions as those in FIG. 1 will be attached with the same symbols as those in FIG. 1, and the redundant descriptions will be omitted.

First Embodiment

Figure 1:
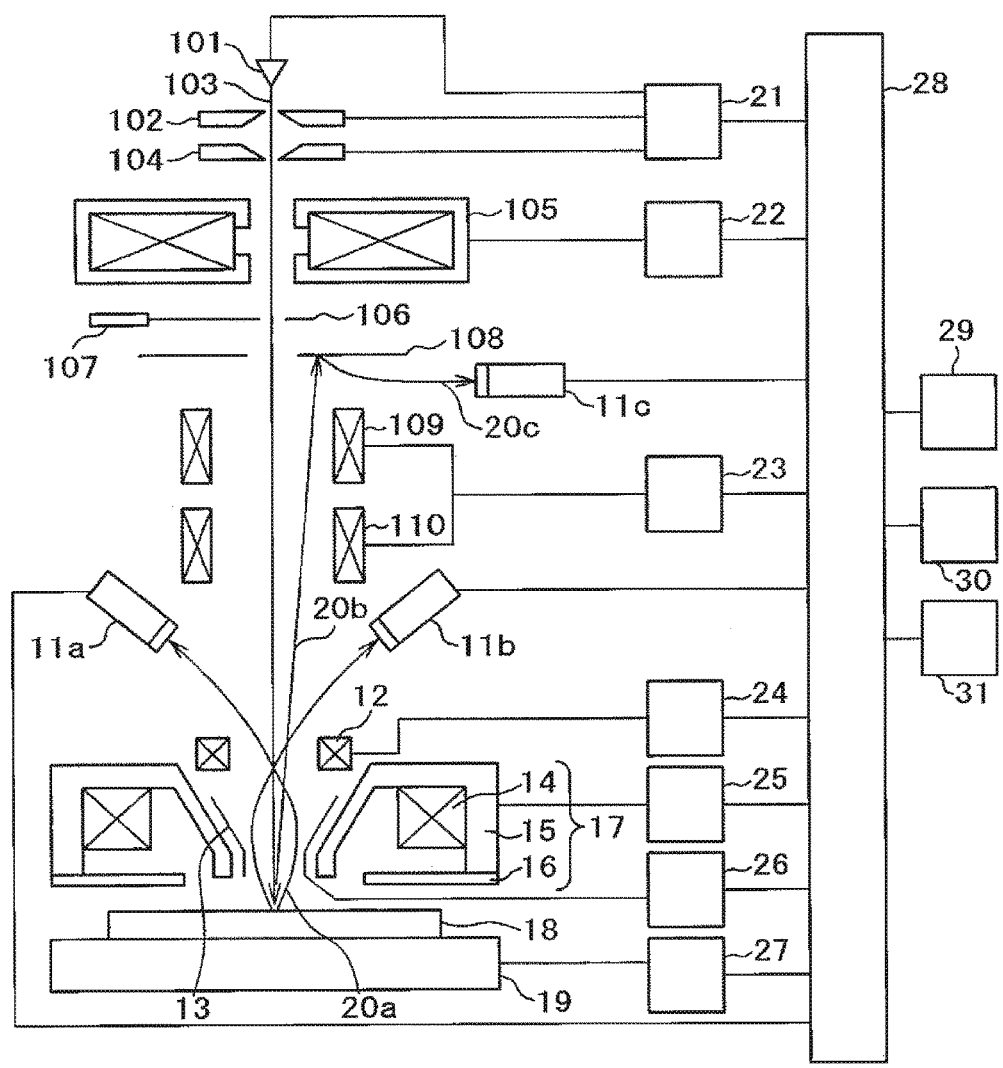
FIG. 1 is a cross-sectional view (partially block diagram) schematically illustrating a configuration of a scanning electron microscope according to a first embodiment.
Figure 2A:
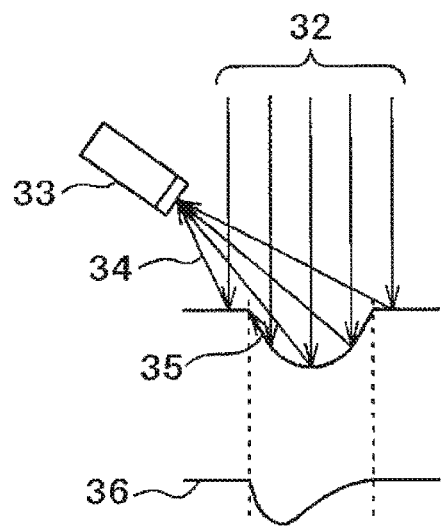
FIG. 2A is a diagram illustrating an example for describing a principle of forming a shaded image using the scanning electron microscope.
Figure 2B:
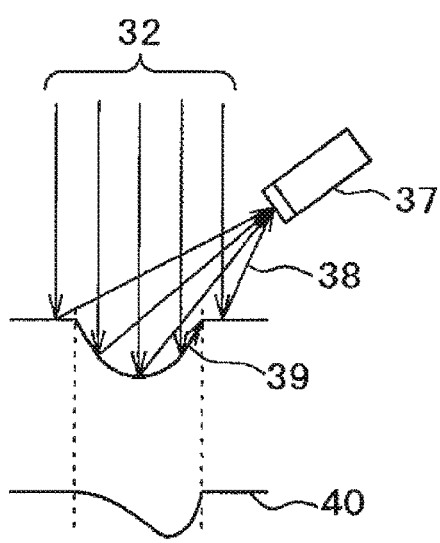
FIG. 2B is a diagram illustrating another example for describing a principle of forming the shaded image using the scanning electron microscope.
Figure 3A:
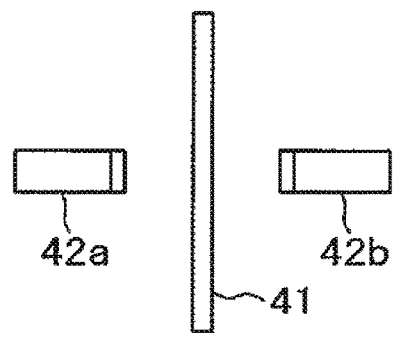
FIG. 3A is a diagram illustrating an example of an optimized layout of two detectors in a vertical line pattern.
Figure 3B:
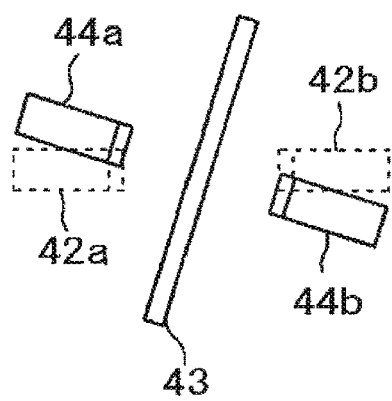
FIG. 3B is a diagram illustrating an example of an optimized layout of two detectors in an inclined line pattern.

FIG. 1 is a diagram schematically illustrating a scanning electron microscope according to a first embodiment of the invention. This embodiment is aimed at performing critical dimensional measurement of a pattern formed in a wafer and inspection on defects or foreign materials on the formed pattern on a large sample such as a semiconductor wafer. There is employed a configuration in a case where the energy of a primary electron beam is a low injection energy of several ten eV to several thousand eV (keV). However, the electron microscope equipped with a plurality of detectors similarly to this embodiment can be applied to any target sample and purpose even when the injection energy is large.

A control calculation device 28 of the entire apparatus reads out the conditions stored in a control table 31, and the respective controllers denoted by Symbols 21 to 27 set voltages and currents in the apparatus. In a case where an operator commands to change a measurement condition, the control table 31 is automatically read, and control parameters are changed. Further, Symbol 21 indicates an electron gun controller, Symbol 22 indicates a focusing lens controller, Symbol 23 indicates a scanning deflector controller, Symbol 24 indicates a coil controller, Symbol 25 indicates an objective lens controller, Symbol 26 indicates an acceleration electrode controller, and Symbol 27 indicates a sample holder controller.

When an extraction voltage is applied between a field emission cathode 101 and an extraction electrode 102, emission electrons (primary electron beam) 103 are emitted. The emission electrons 103 are accelerated still more between the extraction electrode 102 and a grounded anode 104. The energy of the electron beam passing through the anode 104 is matched to an accelerating voltage of an electron gun (including the field emission cathode 101 and the extraction electrode 102). The primary electron beam passing through the anode 104 is focused on the focusing lens 105, deflected in its scanning by an upper scanning deflector 109 and a lower scanning deflector 110, and then narrowed onto the sample by an objective lens 17. The objective lens 17 is configured by an objective lens coil 14, an upper magnetic pole 15, and a lower magnetic pole 16. The magnetic field generated by the objective lens coil 14 is leaked out from a gap between the upper and lower electrodes to be focused on an optical axis so as to be converged on the electron beam 103. An intensity of an electromagnetic lens is adjusted by changing the amount of current of the objective lens coil 14. A negative voltage is applied to a sample holder 19. The primary electron beam that passes through the objective lens 17 is decelerated by a retarding field created between the objective lens 17 and a sample 18, and reaches the sample 18. In this configuration, the energy of the primary electrons at the time of passing through the objective lens 17 becomes higher than the energy which is injected to the sample 18. As a result, when the primary electron beam of the final energy is compared to the case of passing through the objective lens 17, a chromatic aberration in the objective lens 17 is reduced, and a finer electron beam is obtained. Therefore, a high resolution is achieved.

An aperture-limiting semi-angle of the primary electron beam of the objective lens 17 is determined by a diaphragm 106 which is provided below the focusing lens 105. The diaphragm 106 is centered by an adjustment handle 107. While the centering is mechanically performed in the drawing, an electrostatic deflector or a magnetic deflector may be provided before and after the diaphragm 106 to deflect and adjust the electron beam. The electron beam is scanning on the sample by the upper scanning deflector 109 and the lower scanning deflector 110. At this time, the deflection direction and the intensity of the upper scanning deflector 109 and the lower scanning deflector 110 are adjusted such that the scanned electron beam always passes through the center of the objective lens 17.

When the sample 18 is irradiated with the primary electron beam 103, secondary particles 20a and 20b are generated. The secondary particles have a wide energy distribution. The primary electrons injected to the sample are elastically scattered by atoms of the solid surface, and there are generated electrons emitted from the surface of the sample. These are called the reflected electrons, and have the same or slightly higher energy compared to the primary electron beam. On the other hand, the primary electrons injected to the sample interact with the atoms in the sample, and some electrons in the sample are excited and emitted to the outside with movement energy. These are called the secondary electrons, and generally have the energy about in a range from 0 eV to 50 eV. Hereinafter, the secondary electrons and the reflected electrons in this embodiment will be collectively called the secondary particles.

The retarding field with respect to the primary electron beam 103 created between the objective lens 17 and the sample 18 works as an acceleration field with respect to the secondary particles 20a and 20b generated by the sample 18, is attracted into the path of the objective lens 17, and rises to the upper side of the apparatus while receiving a lens operation by the acceleration field by an acceleration electrode 13 and the magnetic field of the objective lens 17. The secondary particles rotate depending on the energy by the lens magnetic field, and pass through the lens magnetic field at high speed by the acceleration field created between the objective lens 17 and the sample 18. Therefore, a difference in rotation angle due to the energy is reduced, and azimuth angle information in the sample is secured in the detector.

Figure 5:
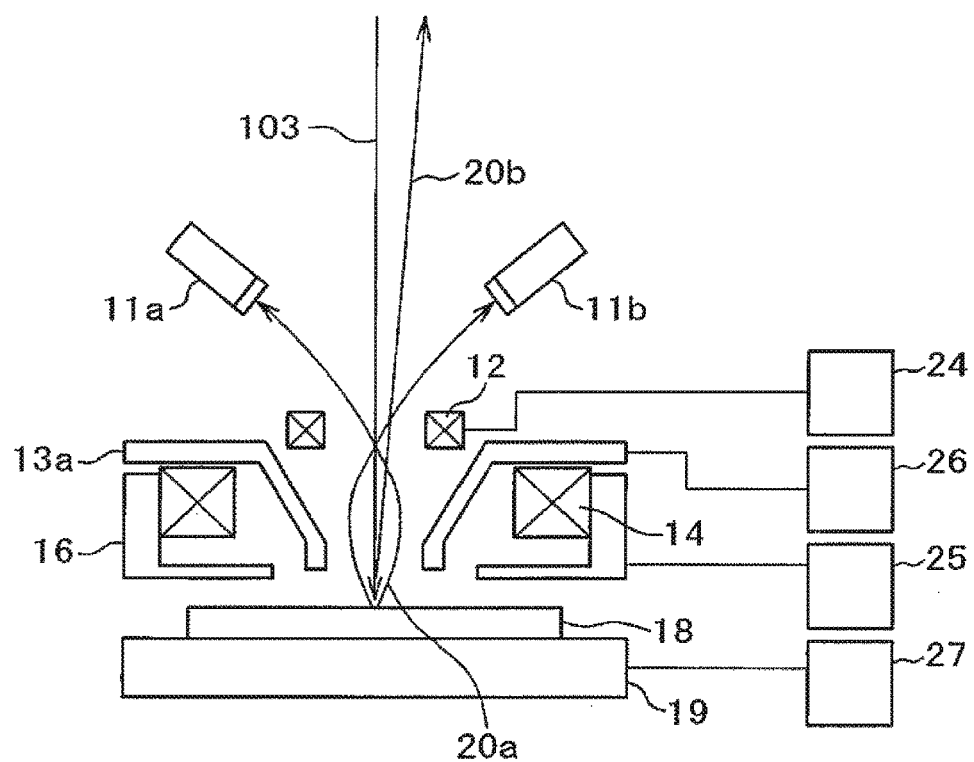
FIG. 5 is a cross-sectional view (partially block diagram) schematically illustrating main parts in an example in which part of a magnetic path of an objective lens is used as an acceleration electrode in the scanning electron microscope illustrated in FIG. 1.

Herein, the acceleration electrode 13 may be not provided. As illustrated in FIG. 5, the upper magnetic pole 15 of the objective lens 17 may be used as an acceleration electrode 13a, and the voltage may be applied independently to the acceleration electrode 13a. Further, since the voltage is applied only to the acceleration electrode 13a, the lower magnetic pole 16 is insulated by making a space or by interposing an insulator therebetween.

Among the accelerated secondary particles 20a and 20b, the secondary particles 20a emitted in a direction forming an angle smaller with respect to the surface of the sample 18 are emitted in a direction away from the optical axis, are brought back toward the optical axis by a leakage magnetic field of the objective lens 17, pass through the objective lens 17, and are detected by the detectors 11a and 11b which are disposed at positions away from the optical axis. In the drawing, there are provided two detectors axis-symmetrically to the optical axis of the primary electron beam, but there may be provided a plurality of detectors. On the other hand, secondary particles 20b emitted in a direction forming an angle larger with respect to the surface of the sample 18 pass through almost the same track as that of the primary electron beam 103. Therefore, the particles are not able to be detected by the detectors 11a and 11b, and come into conflict with a reflecting plate 108. In the reflecting plate, the secondary particles 20c are generated again by the conflict of the secondary particles 20b. The generated secondary particles 20c are detected by a detector 11c which is disposed on a side near the sample from the reflecting plate 108. Further, in place of the reflecting plate 108, the secondary particles may be detected using a micro-channel plate and a semiconductor detector. The secondary particles that reach the detector 11c become a brightness modulation input signal, and are displayed in a monitor 30 as an image and stored in a recording device 29.

An elevation angle component detected by the detectors 11a and 11b is controlled by adjusting the layout positions of the detectors 11a and 11b, a voltage to be applied to the sample holder 19, a voltage of the acceleration electrode 13, and the accelerating voltage. A sample image detected by the detectors 11a and 11b becomes a shaded image which is bright and dark according to irregularities of the sample 18 as illustrated in FIGS. 2A and 2B.

Figure 6A:
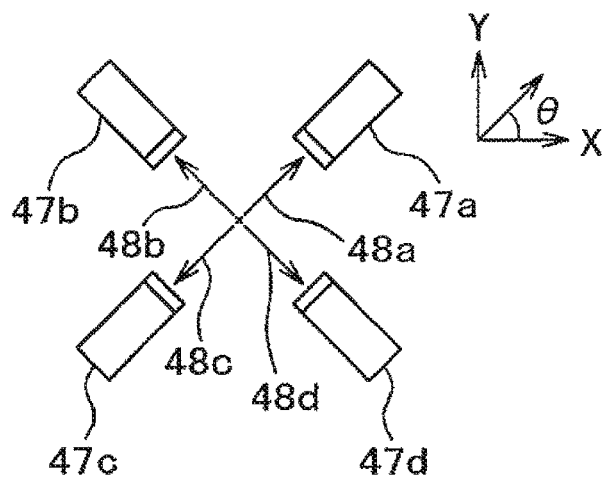
FIG. 6A is a top view illustrating an example of a track of secondary particles moving toward the detector in the related art.

The scanning electron microscope according to this embodiment features a coil 12 which is provided between the objective lens 17 and the detectors 11a and 11b. The function of the coil will be described using FIGS. 6A to 6D. FIGS. 6A and 6C are diagrams of a layout when viewed from an electron source, and illustrating only the detectors and the tracks of the secondary particles in order to help with explanation. Herein, four detectors 47a to 47d are provided so as to be symmetrical to the optical axis and inclined with an angle of 45° from X and Y axes. The secondary particles emitted from angle the sample are rotated by a Lorentz force due to the magnetic field of the objective lens 17, but it will be not considered in the description. In addition, a slope from the X axis is defined as an azimuth angle θ, and a slope from the Z axis is defined as the elevation angle φ.

Figure 6B:
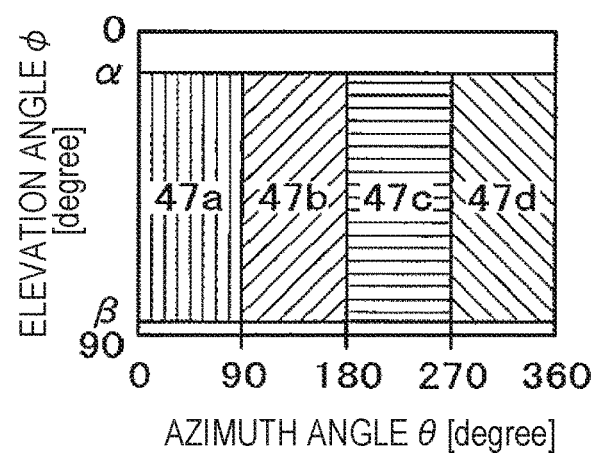
FIG. 6B is a diagram illustrating an example of detection acceptance in the related art.
Figure 6C:
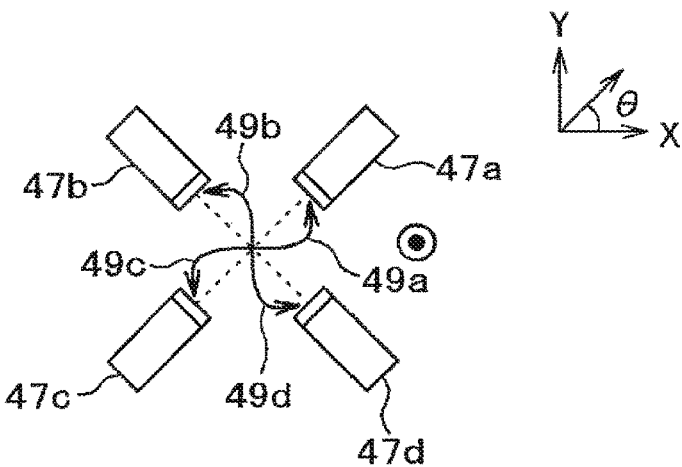
FIG. 6C is a top view illustrating an example of a track of the secondary particles moving toward the detector in the scanning electron microscope illustrated in FIG. 1.

First, the tracks of the secondary particles and the detection acceptance in a case where the coil 12 of this embodiment is not provided are illustrated in FIGS. 6A and 6B. The detectors 47a to 47d detect secondary particles 48a to 48d moving toward 45 degrees, 135 degrees, 225 degrees, and 315 degrees. The secondary particles emitted from the sample spread in all the azimuth angle directions, and a range of a detectable azimuth angle of one detector is determined by an electric field around the detector. Herein, assuming that one detector can detect a 90° range of the azimuth angle, and all the azimuth angle components can be detected by four detectors, the detection acceptance is obtained as illustrated in FIG. 6B. The detector 47a detects 45°±45° range of secondary particles, the detector 47b detects 135°±45° range of secondary particles, the detector 47c detects 225°±45° range of secondary particles, and the detector 47d detects 315°±45° range of secondary particles. An elevation angle component covering 0 degrees to α degrees corresponds to the secondary particles 20b which are emitted in a direction forming a large angle with respect to the surface of the sample 18, and is not detected by the detectors 47a to 47d. In addition, an elevation angle component covering β degrees to 90 degrees corresponds to the secondary particles which are emitted in a direction especially forming a small angle with respect to the surface of the sample 18, and is not detected by the detectors 47a to 47d due to the conflict to the sample or the objective lens.

Figure 4A:
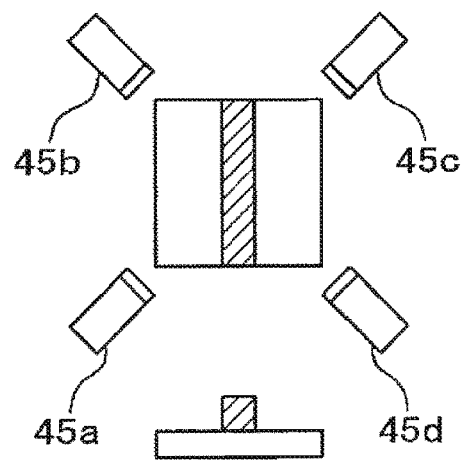
FIG. 4A is a diagram illustrating an example of an optimized layout of the detectors in a line pattern in a case where four detectors are used.
Figure 4B:
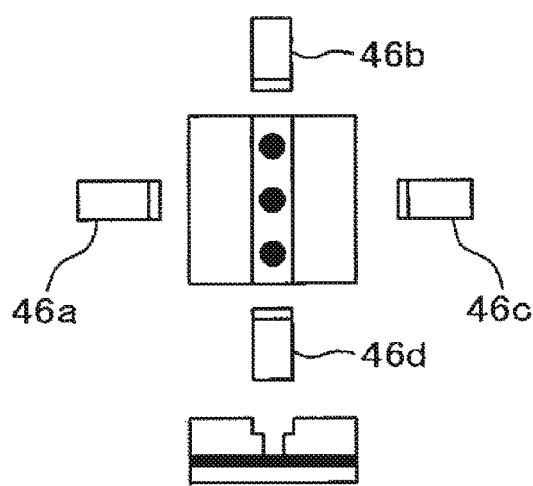
FIG. 4B is a diagram illustrating an example of an optimized layout of the detectors in a VIT pattern in a case where four detectors are used.
Figure 6D:
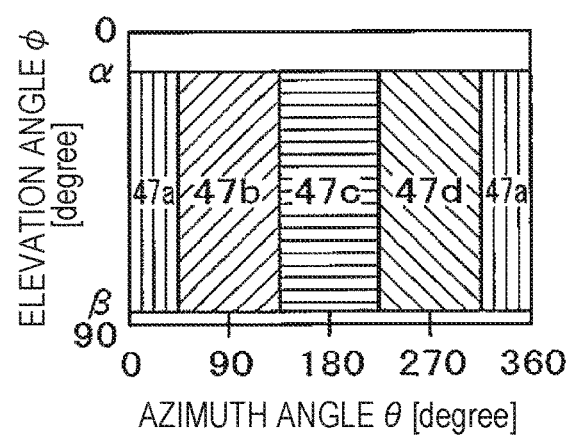
FIG. 6D is a diagram illustrating an example of the detection acceptance in the scanning electron microscope illustrated in FIG. 1.

Next, the tracks of the secondary particles and the detection acceptance in a case where the coil 12 according to this embodiment is provided and a DC current flows to the coil to rotate the secondary particles by 45 degrees are illustrated in FIGS. 6C and 6D. Herein, the DC current flows in the counterclockwise direction, and the magnetic field is generated from the back side of the sheet toward the front side. The detectors 47a to 47d detect secondary particles 49a to 49d moving toward directions of 0 degrees, 90 degrees, 180 degrees, and 270 degrees. Assuming four detectors can detect all the azimuth angle components, the detection acceptance is obtained as illustrated in FIG. 6D. The detector 47a detects 0°±45° range of secondary particles, the detector 47b detects 90°±45° range of secondary particles, the detector 47*c* detects 180°±45° range of secondary particles, and the detector 47*d* detects 270°±45° range of secondary particles. The azimuth angle components detected by the respect detectors can be rotated by 45 degrees compared to the case where the coil 12 is not provided. The detector layout is an optimized layout of the detectors of a line pattern illustrated in FIG. 4A. It is possible to obtain the same function as that of the optimized layout of the detectors of the VIT pattern illustrated in FIG. 4B by causing the DC current to flow to the coil 12 so as to generate the magnetic field. Herein, the description has been given about a case where the secondary particles rotate by 45 degrees. However, the direction and the amount of the rotation of the secondary particles can be controlled by adjusting the direction and the amount of the DC current flowing to the coil 12, and it is possible to make observations on various targets in an optimized condition. Therefore, it is possible to observe both the VIT pattern and the line pattern, and also the secondary particles of an arbitrary azimuth angle can be detected. For example, it is also possible to observe scratches having a random direction. Further, the magnetic field generated at this time can effectively rotate the secondary particles, and simultaneously rotate the primary electron beam. Therefore, when the rotation angle is changed (that is, the direction and the amount of the DC current flowing to the coil 12 are changed), the rotation and the magnification of the deflection of the primary electron beam are interlocked to make a correction to have the same beam condition as that in a case where there is no rotation.

Figure 7:
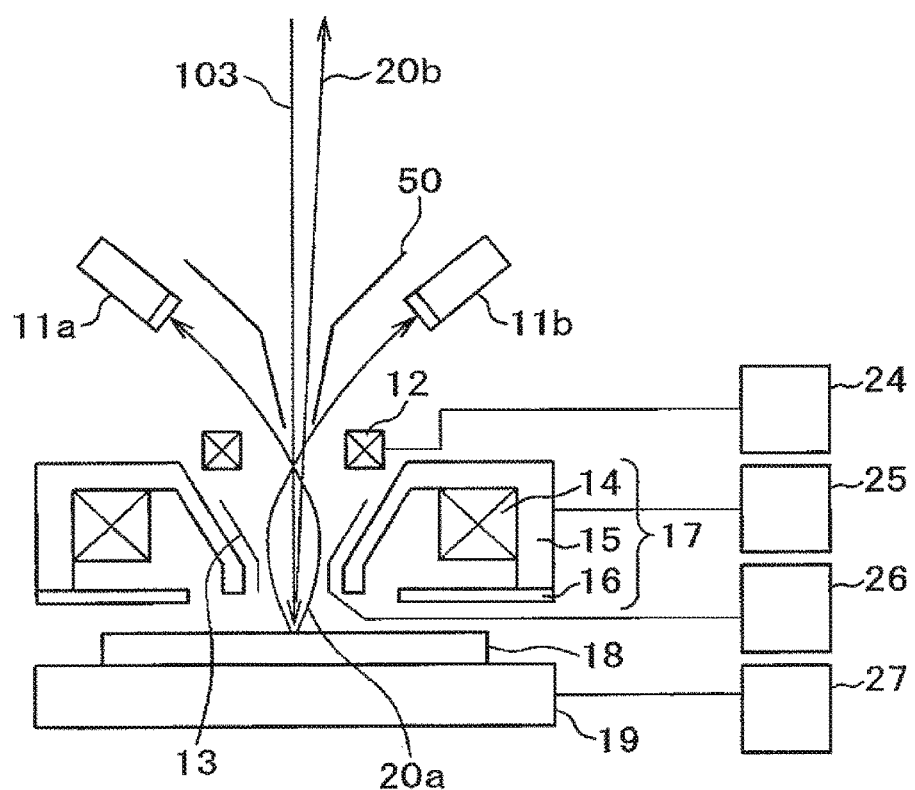
FIG. 7 is a cross-sectional view (partially block diagram) schematically illustrating main parts in an example in which a magnetic shield is disposed between an optical axis of the primary electron beam and a coil in the scanning electron microscope illustrated in FIG. 1.

FIG. 7 is a diagram schematically illustrating another example of this embodiment. Since the configuration from the field emission cathode 101 to the lower scanning deflector 110 is the same as that of FIG. 1. FIG. 7 illustrates the configuration of the lower portion of the detectors 11*a* and 11*b*. Since there is no magnetic pole, the magnetic field generated by the coil 12 is widened up to the optical axis of the primary electron beam 103, and the property and the track of the primary electron beam 103 are changed. In order to make the influence as small as possible, a magnetic shield 50 made of a magnetic material is disposed between the optical axis and the coil 12 as illustrated in FIG. 7 to suppress the leakage of the magnetic field onto the optical axis.

Figure 8:
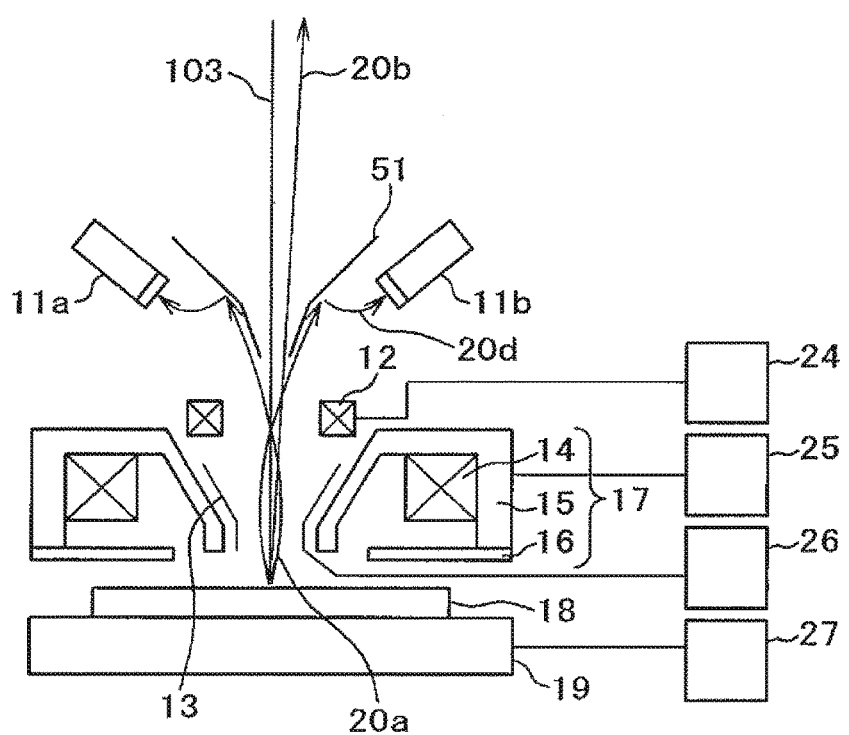
FIG. 8 is a cross-sectional view (partially block diagram) schematically illustrating main parts in an example in which a reflecting plate is provided and the secondary particles generated when the secondary particles come into conflict with the reflecting plate are detected in the scanning electron microscope illustrated FIG. 1.

FIG. 8 is a diagram schematically illustrating another example of this embodiment. Since the configuration from the field emission cathode 101 to the lower scanning deflector 110 is the same as that of FIG. 1. FIG. 8 illustrates the configuration of the lower portion of the detectors 11*a* and 11*b*. The elevation angle of the emission of the secondary particles 20*a* detected by the detectors 11*a* and 11*b* depends on the accelerating voltage, the voltage of the acceleration electrode 13, and the voltage of the sample holder 19. When these voltages become large, the range of the secondary particles from the optical axis becomes small, and approaches the track of the secondary particles 20*b* emitted in a direction forming a large angle with respect to the surface of the sample 18. In a case where there is a need to increase these voltages in order to improve the resolution, a new reflection electrode 51 is provided to make the secondary particles 20*a* come to conflict with the reflection electrode 51 to generate new secondary particles 20*d*. A high voltage of about +10 kV is applied to the front surfaces of the detectors 11*a* and 11*b* to attract the secondary particles 20*d*, so that a detection efficiency of the secondary particles 20*d* can be improved. Further, the reflection electrode 51 may be made of a magnetic material to suppress the leakage of the magnetic field generated by the coil 12 onto the optical axis, so that the same effect as that of the magnetic shield 50 illustrated in FIG. 7 can be obtained.

Figure 9:
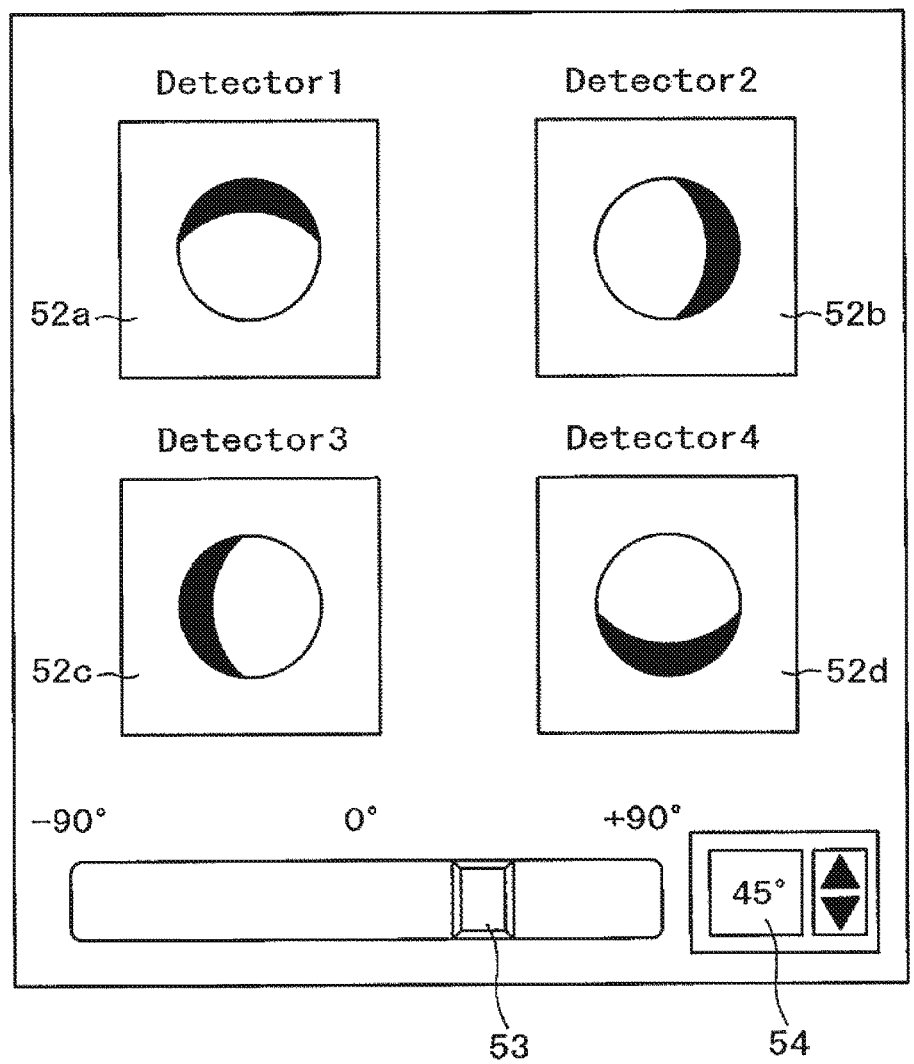
FIG. 9 is a diagram illustrating an example of a GUI to designate a rotation angle of an azimuth angle using the scanning electron microscope according to the first embodiment.
Figure 10:
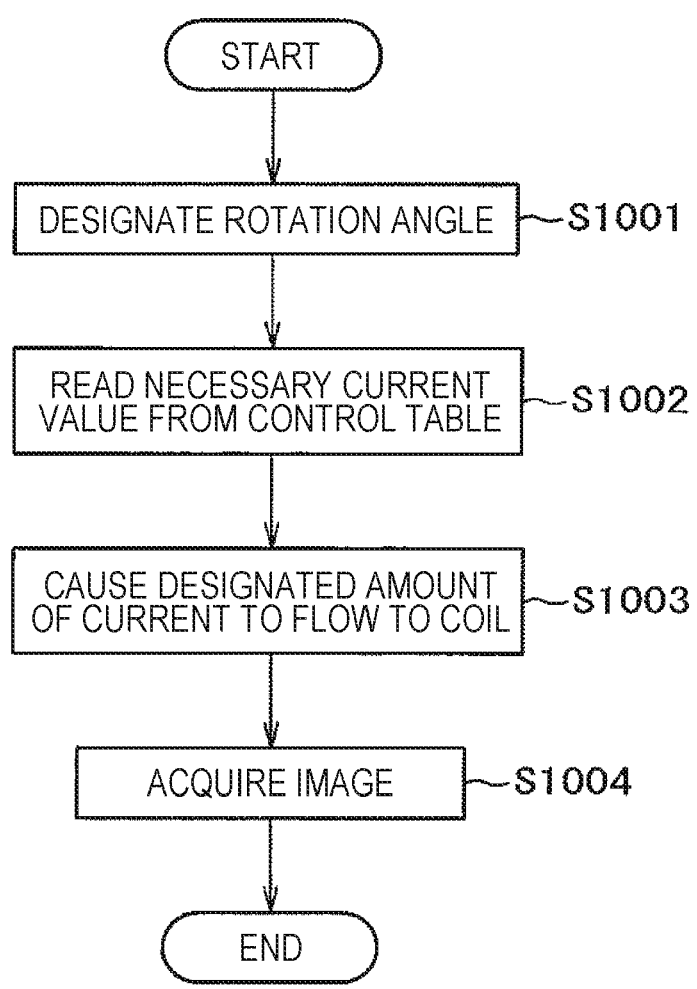
FIG. 10 is a flowchart of designating a rotation angle of the azimuth angle to acquire an image using the scanning electron microscope according to the first embodiment.

FIG. 9 illustrates an example of a GUI (Graphical User Interface) through which an operator of the apparatus can designate a detection angle of the secondary particles, and FIG. 10 illustrates a flowchart of acquiring an image by rotating the azimuth angle by an amount designated using the GUI. Herein, there is illustrated an example of the GUI in a case where four detectors are disposed in axis symmetry. The GUI is displayed in the monitor 30, and the operator works on the monitor. Shaded images 52*a* to 52*d* output from the four detectors are displayed on a GUI screen. The shaded images 52*a*, 52*b*, 52*c*, and 52*d* correspond to the detectors 47*b*, 47*a*, 47*d*, and 47*c* of FIG. 6C respectively. The rotation angle of the azimuth angle varies in a range from −90° to +90°, and the rotation angle may be designated using a slider 53 or may be directly designated in an angle designating box 54. The shaded image in the drawing illustrates a hole pattern, and the shaded images of the respective detectors are rotated by 45° in a counterclockwise direction.

First, the operator designates a rotation angle using the slider 53 or the angle designating box 54 to make a desired rotation on the GUI of FIG. 9 (S1001). Next, the apparatus automatically selects the amount of current of the coil 12 satisfying the rotation angle from the control table 31 (S1002), and adjusts the direction and the amount of current flowing to the coil 12 using the coil controller (S1003). A relation between the rotation angle and the amount of current of the coil 12 is stored in the control table 31 in advance for the respective voltage conditions of the accelerating voltage, the acceleration electrode 13, and the sample holder 19. The relation may be created on the basis of a result of a simulation using calculation of electromagnetic field and the track of the electrons, or may be created based on an experimental result. Finally, an image rotated in a detected azimuth angle is acquired (S1004). Therefore, the image can be obtained by arbitrarily selecting an azimuth angle of the secondary particles to be detected according to the shape of the sample.

Figure 11:
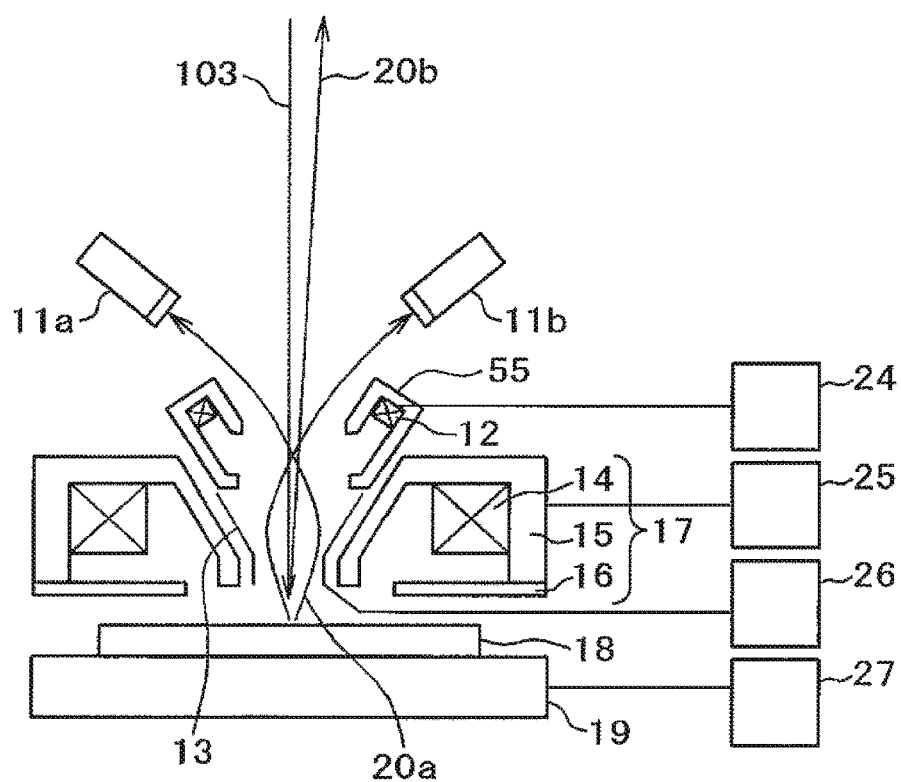
FIG. 11 is a cross-sectional view (partially block diagram) schematically illustrating main parts in an example in which the coil is covered with a notched magnetic pole in the scanning electron microscope illustrated in FIG. 1.

FIG. 11 is a diagram schematically illustrating another example of this embodiment. Since the configuration from the field emission cathode 101 to a lower deflector 10 is the same as that of FIG. 1, FIG. 11 illustrates the configuration of the lower portion of the detectors 11*a* and 11*b*. Almost all the configuration is the same as that of FIG. 1 except that the coils 12 are disposed at positions facing the optical axis with a gap therebetween and covered by a magnetic pole 55. Magnetic flux lines generated by the current flowing to the coil 12 leak from the gap out to the space, and form a rotationally symmetric magnetic field. Since the magnetic flux lines intensively leak out from the gap compared to the structure where the coil 12 is not covered by the magnetic pole, a strong magnetic field can be generated in a narrow range with a less amount of current. Since the secondary particles can be greatly rotated as the magnetic field strong, a large effect is obtained compared to a case where only the coil 12 is used. However, when the magnetic pole is provided as illustrated in FIG. 11, the magnetic field becomes strong and the rotating of the secondary particles can be increased. At the same time, the rotating with respect to the primary electron beam is also increased. In this case, the magnetic shield 50 is provided between the magnetic pole 55 and the optical axis as illustrated in FIG. 7 to reduce the leakage of the magnetic field to the optical axis, so that the rotating with respect to the primary electron beam can be suppressed.

Figure 12A:
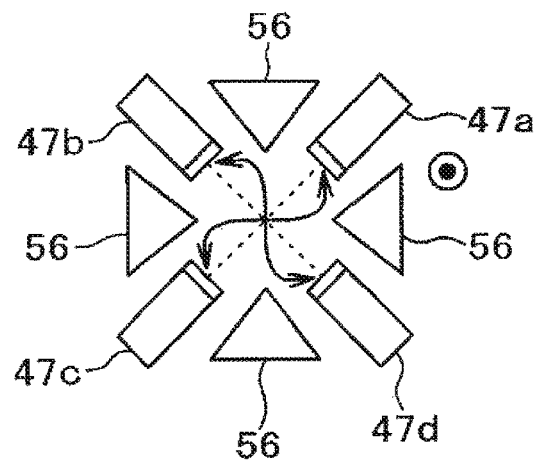
FIG. 12A is a top view illustrating an example of a track of secondary electrons when four detectors are disposed and the electrodes are disposed between the detectors in the scanning electron microscope according to the first embodiment.
Figure 12B:
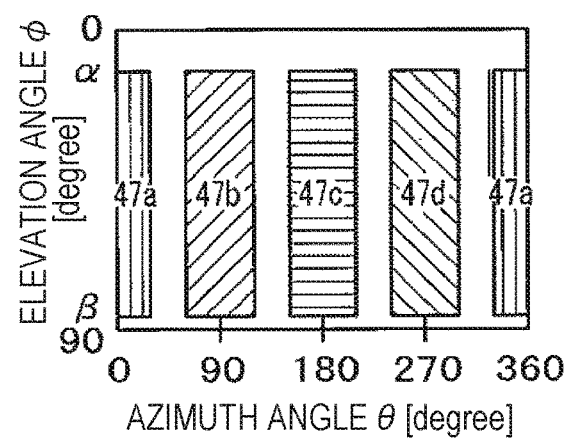
FIG. 12B is a diagram illustrating an example of the detection acceptance when four detectors are disposed and the electrodes are disposed between the detectors in the scanning electron microscope according to the first embodiment.

FIG. 12A is a top view illustrating an example of the track of the secondary electrons when four detectors are disposed and the electrode is disposed between the detectors in this scanning electron microscope. In addition, FIG. 12B is a detection acceptance obtained by this configuration. FIG. 12A illustrates a layout when viewed from the electron source side. The four detectors 47a to 47d are provided symmetrically to the optical axis, and an electrode 56 is provided between the detectors. An electric field formed by the electrode 56 and the detectors 47a to 47d is operated in the azimuth angle direction of the secondary particles emitted from the sample. Therefore, the secondary particles flying between the adjacent detectors may be deflected in a direction toward the detector by controlling a voltage applied to the electrode 56, or may be deflected in a direction away from the detector. As illustrated in FIGS. 6B and 6D, in a case where the apparatus is designed such that all the azimuth angle components are detected, the secondary particles are deflected in a direction away from the detector by applying a positive voltage to the electrode 56, and it is possible to limit the azimuth angle which can be detected by one detector in the usage. On the other hand, in a case where a 90° component is not detectable by one detector from the viewpoint of design of the apparatus, the secondary particles are deflected in a direction toward the detector by applying a negative voltage to the electrode 56, and it is possible to widen the azimuth angle which can be detected by one detector in the usage. In addition, the detectable azimuth angle may be further limited by applying a positive voltage in the usage.

In this way, the azimuth angle which can be detected by one detector can be controlled by providing an electrode between the detectors. When the azimuth angle component which can be detected by one detector is expressed by $\theta_A° \pm \theta_B°$, the magnitude of $\theta_B$ is controlled by the electrode 56. The rotation member (the coil 12 and the coil controller 24) according to this embodiment controls $\theta_A$, and the central angle and the width of the detectable azimuth angle can be arbitrarily set by combining the rotation member and the electrode 56. Therefore, it is possible to observe a target with a high accuracy by controlling the central angle and the width according to the observation target. Herein, FIG. 12A illustrates an example in which four detectors are disposed in axis symmetry, but the number of detectors is not limited thereto. The electrodes corresponding to the electrode 56 may be provided as many as the number of detectors, or may be provided more or less than the number of detectors. In addition, at this time, all the voltages to be applied to the electrode may be the same potential, or may be changed differently from each other. In a case where the same voltage is applied, the electrodes may be integrated.

Hitherto, according to this embodiment, it is possible to provide a charged particle beam apparatus through which the VIT pattern and the line pattern both can be observed and evaluated. In addition, it is possible to obtain an image by arbitrarily selecting an azimuth angle of the secondary particles which is detected according to the shape of the sample. In addition, it is possible to prevent a new acceleration electrode from being provided by using the upper magnetic pole of the objective lens as the acceleration electrode of the secondary particles. In addition, it is possible to suppress that the magnetic field of the coil 12 leaks out to the optical axis by disposing the magnetic shield between the optical axis and the coil 12. In addition, it is possible to improve the efficiency in detection of the secondary particles disposing the reflecting plate to generate new secondary particles by making the secondary particles emitted in the direction forming a small angle come into conflict with the surface of the sample. In addition, it is possible to rotate the secondary particles greatly by disposing the magnetic pole which covers the coil 12 with a gap therebetween at a position facing the optical axis. In addition, it is possible to limit or widen the azimuth angle of the secondary particles which can be detected by one detector by disposing an electrode between the detectors.

Second Embodiment

Figure 13:
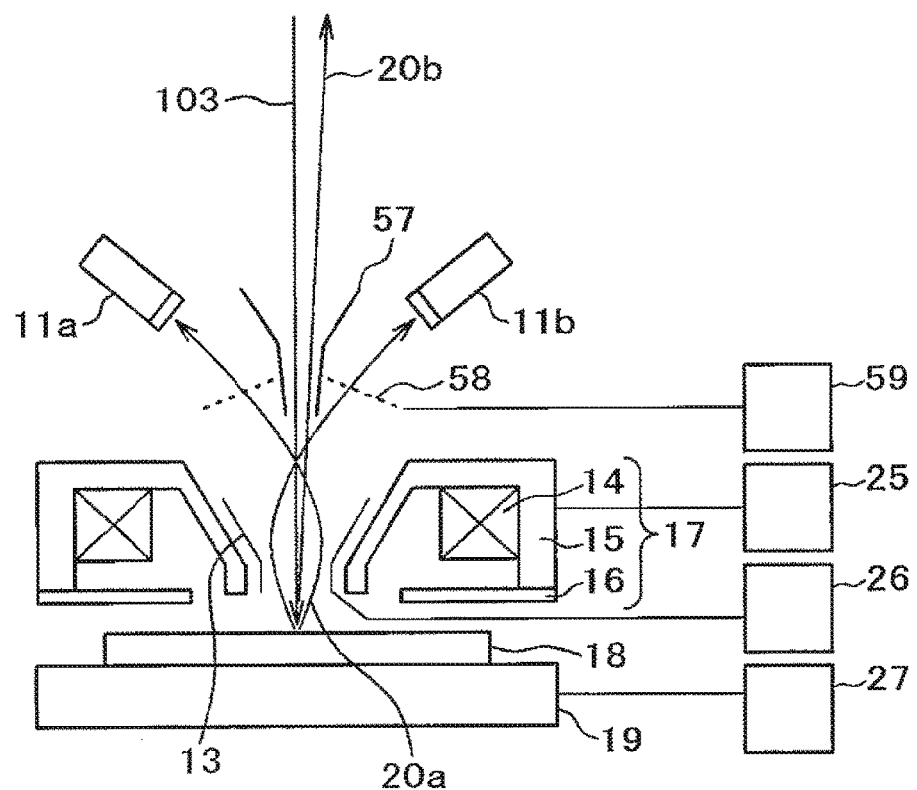
FIG. 13 is a cross-sectional view (partially block diagram) schematically illustrating main parts of a scanning electron microscope according to a second embodiment.
Figure 14:
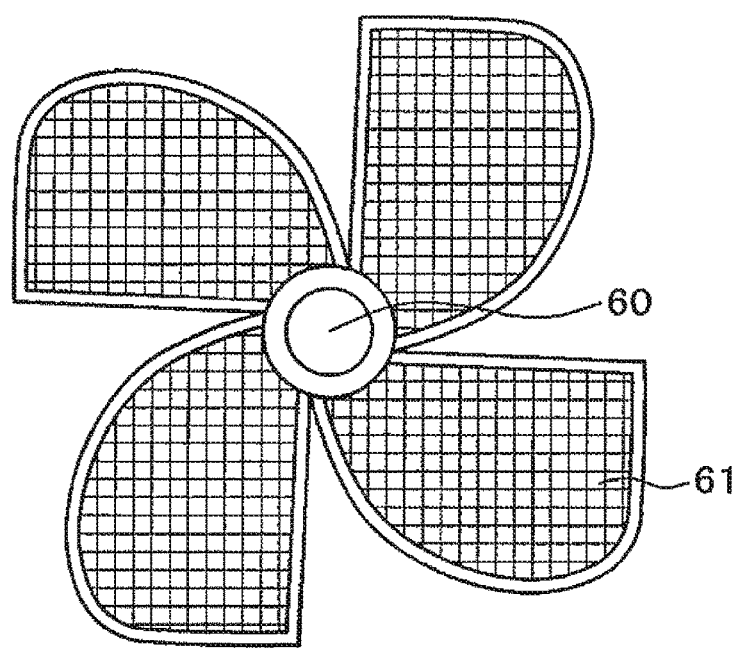
FIG. 14 is a plan view illustrating an example of a shape of a rotation control electrode in the scanning electron microscope according to the second embodiment.

A second embodiment will be described using FIGS. 13 and 14. Further, if not otherwise specified, matters which are described in the first embodiment but not in this embodiment may also be applied to this embodiment.

The description in the first embodiment has been given about an example in which the secondary particles are rotated by the magnetic field. However, the description in this embodiment will be given about an example in which the secondary particles are rotated by the electric field. FIG. 13 is a diagram schematically illustrating the scanning electron microscope according to this embodiment. Since the configuration from the field emission cathode 101 to the lower scanning deflector 110 is the same as that of FIG. 1, FIG. 13 illustrates the configuration of the lower portion of the detectors 11a and 11b. The secondary particles emitted from the sample 18 when being irradiated with the primary electron beam 103 are attracted into the passage of the objective lens 17 by the acceleration field created between the objective lens 17 and the sample 18, and rise to the upper side of the apparatus while receiving a lens operation by the acceleration field by the acceleration electrode 13 and the magnetic field of the objective lens 17. A rotation control electrode 58 is provided on the upper side of the objective lens 17. The track of the secondary particles which are rotated and rise by applying a voltage to the rotation control electrode 58 is changed, and the azimuth angle detected by each detector is changed. The rotation control electrode 58 has a screw structure as illustrated in FIG. 14, and includes a center hole 60 for allowing the primary electron beam 103 to pass through, and a mesh (net) 61 for allowing the secondary particles to pass through. The mesh 61 is used to apply an equipotential to a blade region of the screw. If there is no need to apply the equipotential, the mesh may be not provided. In addition, a shield electrode 57 is provided between the optical axis and the rotation control electrode 58 to suppress that the electric field formed by the rotation control electrode 58 leaks out to the optical axis, and an influence on the primary electron beam is reduced.

A controller 59 for the rotation control electrode has a function of reading a voltage required to obtain a desired rotation amount with respect to the secondary particles from the control table 31, and applying the voltage to the rotation control electrode 58. A relation between the rotation angle and the voltage of the rotation control electrode 58 for the respective voltage conditions of the accelerating voltage, the acceleration electrode 13, and the sample holder 19 is stored in the control table 31 in advance. The relation may be created on the basis of a result of a simulation using calculation of electromagnetic field and the track of the electrons, or may be created based on an experimental result.

This embodiment has been described about an example in which the rotation control electrode 58 is employed in a case where four detectors are disposed, and four blades in the screw shape are provided. The number of blades may be changed according to the number of detectors. For example, in a case where two detectors are used, there is disposed the rotation control electrode 58 of the screw type which includes two blades. Further, this embodiment has been described about an example in which the rotation control electrode 58 of the screw type is employed to rotate the secondary particles by the electric field. Other electrode shapes may be used as long as the electrode can operate to rotate the secondary particles.

Even in this embodiment, it is possible to provide a charged particle beam apparatus through which the VIT pattern and the line pattern both can be observed and evaluated. In addition, it is possible to obtain an image by arbitrarily selecting an azimuth angle of the secondary particles which is detected according to the shape of the sample. In addition, it is possible to suppress that the magnetic field of the rotation control electrode 58 leaks out to the optical axis by disposing the shield electrode between the optical axis and the rotation control electrode 58.

Third Embodiment

Figure 15:
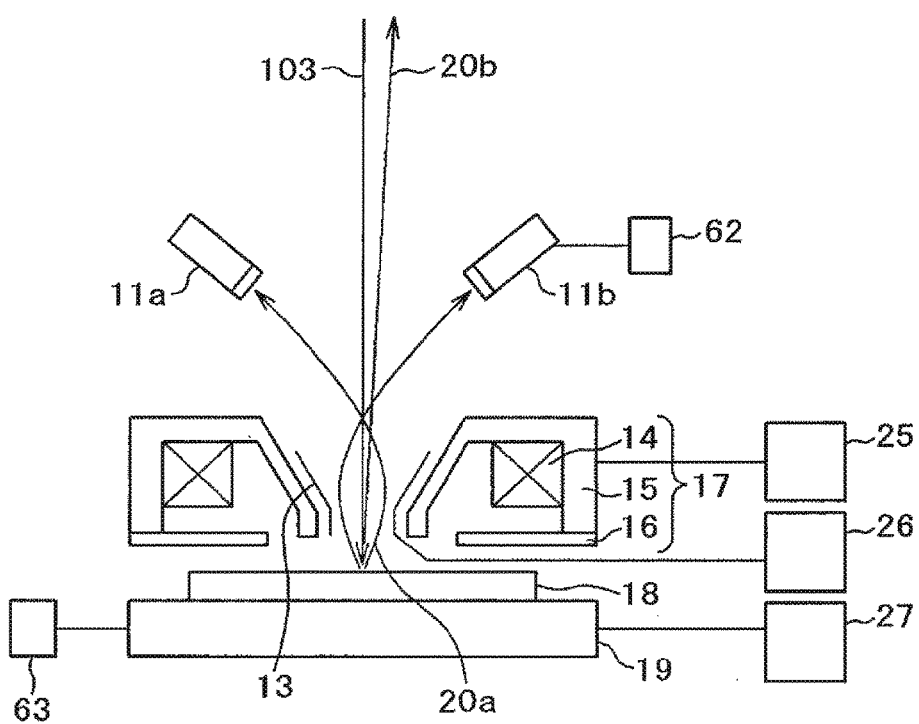
FIG. 15 is a cross-sectional view (partially block diagram) schematically illustrating main parts of a scanning electron microscope according to a third embodiment.

A third embodiment will be described using FIG. 15. Further, matters which are described in the first or second embodiment but not in this embodiment may also be applied to this embodiment.

The first and second embodiments have been described about an example in which the secondary particles 20a emitted from the sample 18 are rotated using the magnetic field or the electric field for the detection using the detectors 11a and 11b. In this embodiment, the description will be given about an example in which the azimuth angle of the detected secondary particles is rotated mechanically rotating the detectors 11a and 11b or the sample holder 19 with respect to the optical axis. FIG. 15 is a diagram schematically illustrating the scanning electron microscope according to this embodiment. Since the configuration from the field emission cathode 101 to the lower scanning deflector 110 is the same as that of FIG. 1, the description of these structures is omitted in FIG. 15.

In the configuration described in the first and second embodiments, the detectors 11a and 11b and the sample holder 19 are fixed. Therefore, the azimuth angle component detected by the detectors 11a and 11b is determined according to the voltage conditions of the accelerating voltage, the acceleration electrode 13, and the sample holder 19. Herein, there are provided with a detector rotary motor 62 which mechanically rotates the member holding the detectors 11a and 11b about the optical axis, and a sample holding rotary motor 63 which mechanically rotates the sample holder 19 with respect to the optical axis, so that the detected azimuth angle of the secondary particles is rotated. With these rotary motors, the detected azimuth angle can be rotated without providing the coil 12 and the magnetic pole 55 described in the first embodiment, or without providing the rotation control electrode 58 described in the second embodiment.

Even in this embodiment, it is possible to provide a charged particle beam apparatus through which the VIT pattern and the line pattern both can be observed and evaluated. In addition, it is possible to obtain an image by arbitrarily selecting an azimuth angle of the secondary particles which is detected according to the shape of the sample. In addition, it is possible to observe and evaluate the VIT pattern and the line pattern without changing an electronic optical system by providing the rotary motor 62 or 63.

Fourth Embodiment

A fourth embodiment will be described using FIG. 16. Further, if not otherwise specified, matters which are described in the first to third embodiments but not in this embodiment may also be applied to this embodiment.

Figure 16:
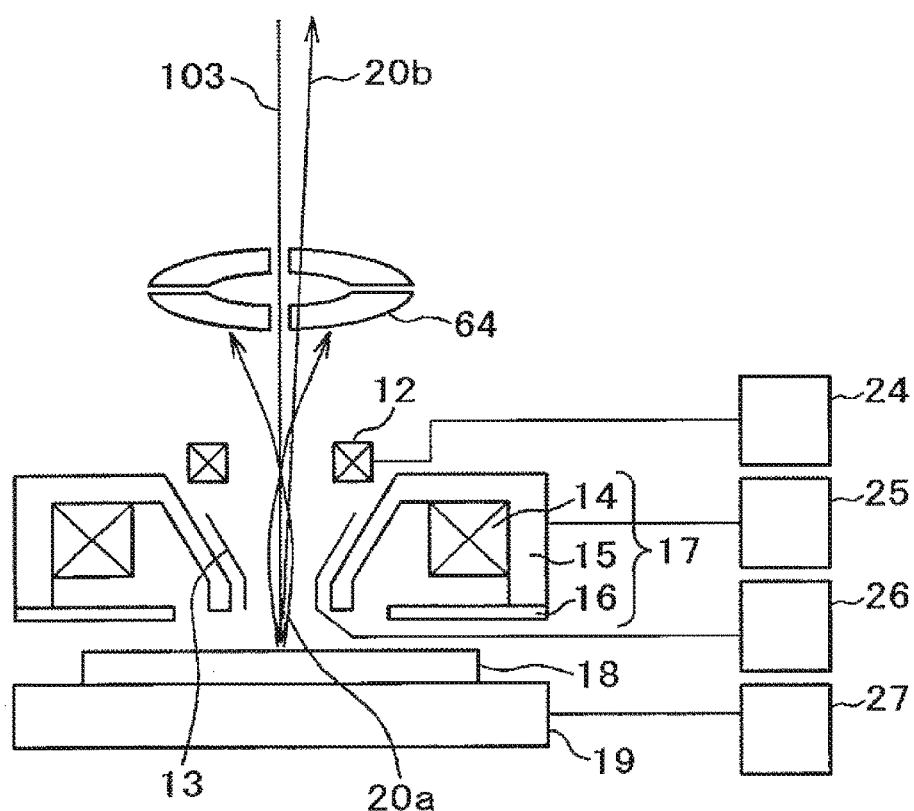
FIG. 16 is a cross-sectional view (partially block diagram) schematically illustrating main parts of a scanning electron microscope according to a fourth embodiment.

FIG. 16 is a diagram schematically illustrating the scanning electron microscope according to this embodiment. As illustrated in FIG. 16, in this embodiment, an annular detector 64 divided into four parts is disposed between an the lower scanning deflector 110 and the coil 12 in place of the detectors 11a and 11b in FIG. 1 of the first embodiment. Further, since the configuration from the field emission cathode 101 to the lower scanning deflector 110 is the same as that of FIG. 1, the description of these structures is omitted in FIG. 16. The annular detector 64 is a microchannel plate or a semiconductor detector. The secondary particles emitted from the sample are attracted into the passage of the objective lens 17 by the acceleration field created between the objective lens 17 and the sample 18, and rise to the upper side of the apparatus while receiving a lens operation by the acceleration field by the acceleration electrode 13 and the magnetic field of the objective lens 17. Thereafter, the secondary particles 20a receive the rotation operation the coil 12, and are detected by the annular detector 64. The rotation amount of the secondary particles 20a is changed by changing the amount of current flowing to the coil 12, so that the azimuth angle component of the secondary particles detected in each portion divided in the annular detector 64 can be controlled. Further, the annular detector 64 which is divided into four parts has been described in this embodiment, and the number of division may be larger or smaller than four.

Even in this embodiment, it is possible to provide a charged particle beam apparatus through which the VIT pattern and the line pattern both can be observed and evaluated. In addition, it is possible to obtain an image by arbitrarily selecting an azimuth angle of the secondary particles which is detected according to the shape of the sample.

Further, the invention is not limited to the above embodiments, and various modifications can be made. For example, the embodiments are described in a clearly understandable way for the invention, and thus the invention is not necessarily to provide all the configurations described above. In addition, some configurations of a certain embodiment may also be replaced with the configurations of another embodiment, and the configuration of the other embodiment may also be added to the configuration of a certain embodiment. Furthermore, additions, omissions, and substitutions may be made on some configurations of each embodiment using other configurations.

What is claimed is:

1. A charged particle beam apparatus, comprising:
   a charged particle source;
   a sample table on which a sample is placed;
   a charged particle beam optical system that includes an objective lens, and focuses charged particles emitted from the charged particle source onto the sample as a charged particle beam;
   a plurality of detectors that detect secondary particles emitted from the sample;
   a rotation member that magnetically, electrically, or mechanically changes a detected azimuth angle of the secondary particles in the detectors; and
   an electrode that is disposed between the plurality of detectors to operate in an azimuth angle direction of the secondary particles.

2. The charged particle beam apparatus according to claim 1,
   wherein the rotation member is a member that magnetically changes the detected azimuth angle, and includes a coil disposed between the objective lens and the plurality of detectors.

3. The charged particle beam apparatus according to claim 2, further comprising:

a magnetic pole that contains the coil, and includes a gap in a direction of an optical axis of the charged particle beam.

4. The charged particle beam apparatus according to claim 2, further comprising:
a magnetic shield that is disposed between an optical axis of the charged particle beam and the coil.

5. The charged particle beam apparatus according to claim 1,
wherein the plurality of detectors are disposed symmetrically to an optical axis of the charged particle beam.

6. The charged particle beam apparatus according to claim 1,
wherein the objective lens includes an upper magnetic pole and a lower magnetic pole, and
wherein the upper magnetic pole serves also as an electrode that accelerates the secondary particles emitted from the sample in a direction toward the plurality of detectors.

7. The charged particle beam apparatus according to claim 1, further comprising:
a reflection electrode that is disposed between the optical axis and the plurality of detectors to generate new secondary particles when the secondary particles come into conflict.

8. The charged particle beam apparatus according to claim 1,
wherein the rotation member is a member that mechanically changes the detected azimuth angle, and is a member that mechanically rotates the plurality of detectors or a member that mechanically rotates the sample table.

9. The charged particle beam apparatus according to claim 1,
wherein the plurality of detectors form an annular detector that is divided into plural pieces.

10. A charged particle beam apparatus, comprising:
a charged particle source;
a sample table on which a sample is placed;
a charged particle beam optical system that includes an objective lens, and focuses charged particles emitted from the charged particle source onto the sample as a charged particle beam;
a plurality of detectors that detect secondary particles emitted from the sample; and
a rotation member that magnetically, electrically, or mechanically changes a detected azimuth angle of the secondary particles in the detectors;
wherein the rotation member is a member that electrically changes the detected azimuth angle, and is a rotation control electrode that is disposed between the objective lens and the plurality of detectors.

11. The charged particle beam apparatus according to claim 10,
wherein the rotation control electrode is a meshed electrode,
the charged particle beam apparatus, further comprising:
an electric shield that is disposed between the optical axis and the meshed electrode.

12. A charged particle beam apparatus, comprising:
a charged particle source;
a sample table on which a sample is placed;
a charged particle beam optical system that focuses charged particles emitted from the charged particle source onto the sample as a charged particle beam;
a plurality of detectors that are disposed at positions symmetrically to an optical axis of the charged particle beam, and detect secondary particles emitted from the sample when being irradiated with the charged particle beam;
a rotation member that changes a detected azimuth angle of the secondary particles in the detectors; and
a controller that is connected to a monitor to display a rotation angle of the azimuth angle of the secondary particles, and controls components of the charged particle beam apparatus; and
an electrode that is disposed between the plurality of detectors to operate in an azimuth angle direction of the secondary particles.

13. The charged particle beam apparatus according to claim 12, further comprising:
a control table that is connected to the controller, and stores data to control the rotation member on the basis of the rotation angle designated from the monitor.

* * * * *